United States Patent
Zingsem et al.

(10) Patent No.: US 10,614,902 B1
(45) Date of Patent: Apr. 7, 2020

(54) TUBULAR NANOSIZED MAGNETIC WIRES WITH 360° MAGNETIC DOMAIN WALLS

(71) Applicant: Universität Duisburg-Essen, Essen (DE)

(72) Inventors: Benjamin Zingsem, Mönchengladbach (DE); Michael Farle, Mülheim a. d. Ruhr (DE); Thomas Feggeler, Essen (DE); Irene Iglesias, Duisburg (DE)

(73) Assignee: Universität Duisburg-Essen, Essen (DE)

( * ) Notice: Subject to any disclaimer, the term of this patent is extended or adjusted under 35 U.S.C. 154(b) by 0 days.

(21) Appl. No.: 16/151,696

(22) Filed: Oct. 4, 2018

(51) Int. Cl.
| | | |
|---|---|---|
| *G11C 19/02* | (2006.01) | |
| *G11C 19/38* | (2006.01) | |
| *G11C 19/08* | (2006.01) | |
| *G11C 11/14* | (2006.01) | |
| *G11C 11/16* | (2006.01) | |

(52) U.S. Cl.
CPC .......... *G11C 19/0808* (2013.01); *G11C 11/14* (2013.01); *G11C 11/1673* (2013.01); *G11C 11/1675* (2013.01)

(58) Field of Classification Search
CPC . G11C 19/0808; G11C 11/14; G11C 11/1673; G11C 11/1675
USPC .......................................................... 365/80
See application file for complete search history.

(56) References Cited

U.S. PATENT DOCUMENTS

| | | | | |
|---|---|---|---|---|
| 7,626,844 | B1* | 12/2009 | Moriya .............. | G11C 19/0841 365/158 |
| 8,750,013 | B1* | 6/2014 | Abraham ........... | G11C 19/0808 365/158 |
| 9,293,696 | B2* | 3/2016 | Ootera ............... | G11C 19/0841 |
| 10,026,431 | B2* | 7/2018 | Bromberg ............... | G11B 5/84 |
| 10,201,715 | B2* | 2/2019 | Wang ..................... | A61N 2/006 |
| 2005/0026307 | A1* | 2/2005 | Osipov ................... | G11C 11/16 438/3 |
| 2006/0120132 | A1* | 6/2006 | Parkin ..................... | G11C 11/14 365/80 |
| 2008/0231392 | A1* | 9/2008 | Kim ....................... | G11C 13/06 333/147 |
| 2013/0322151 | A1* | 12/2013 | Allenspach ........ | G11C 19/0808 365/145 |
| 2014/0009994 | A1* | 1/2014 | Parkin ..................... | H01L 43/10 365/80 |
| 2015/0137200 | A1* | 5/2015 | Johnson .................. | G11C 11/18 257/295 |

(Continued)

*Primary Examiner* — Ly D Pham
(74) *Attorney, Agent, or Firm* — Davidson, Davidson & Kappel, LLC

(57) ABSTRACT

The present invention is directed towards a tubular nanosized magnetic wire, wherein the nanosized magnetic wire comprises: a tubular magnetic shell surrounding a longitudinal axis of the wire, at least one region of the tubular magnetic shell is capable of providing a 360° magnetic domain wall, wherein the 360° magnetic domain wall is self-stabilizing and has a magnetization going from a parallel alignment to a perpendicular alignment and to a parallel alignment with regards to the wire axis. The present invention also provides a practical method capable of making a tubular nanosized magnetic wire with a self-stabilizing, 360° magnetic domain wall. The present invention also relates to the use of the tubular nanosized magnetic wire in a racetrack memory device.

6 Claims, 3 Drawing Sheets a)      b)

(56) References Cited

U.S. PATENT DOCUMENTS

2016/0056368 A1* 2/2016 Parkin ................ G11C 19/0808
 438/3
2018/0108390 A1* 4/2018 Fukami .................. H01L 43/08

* cited by examiner a) b)

TUBULAR NANOSIZED MAGNETIC WIRES WITH 360° MAGNETIC DOMAIN WALLS

FIELD OF THE INVENTION

The invention relates to the field of tubular nanosized magnetic wire and in particular to a tubular nanosized magnetic wire comprising a tubular magnetic shell surrounding a longitudinal axis of the wire, wherein at least one region of the tubular magnetic shell is capable of providing a 360° magnetic domain wall. The invention also relates to a racetrack memory device making use of tubular nanosized magnetic wires with 360° magnetic domain walls.

BACKGROUND OF THE INVENTION

Magnetic materials have been used in functional devices for decades, such as recording devices including hard disk drives (HDDs), magnetoresistive random-access memory (MRAM), bubble and thin-film data storage, sensor and domain shift register devices. Most of these traditional functional devices are based on the control of magnetic domains. For example, recording media use single magnetic domain states with two opposite magnetization directions to represent the information bits 0 and 1. Material morphology, geometry and intrinsic parameters influence the specific magnetic domain formation and shape, and hence, do directly or indirectly affect the relevant functionalities based on magnetic domains. Magnetic domain walls have been moved and transformed by a magnetic field or a spin-polarized current in planar magnetic wires and rods resulting in new concepts for magnetic memory, storage and logic devices.

In the document by Fert, A., Cros, V. & Sampaio, J. Skyrmions on the track. Nature Nanotechnology 8, 152 (2013), magnetic skyrmions are described which are nanoscale spin configurations that hold promise as information carriers in ultradense memory and logic devices owing to the extremely low spin-polarized currents needed to move them. Magnetic skyrmions are chiral spin structures with a whirling configuration. As their structure cannot be continuously deformed to a ferromagnetic or other magnetic state, skyrmions are topologically protected and relatively stable structures, in comparison with, for example, magnetic vortices or bubbles. To figure out how to stabilize skyrmions on tubular nanosized magnetic wires is still a big challenge.

SUMMARY OF THE INVENTION

Much research into domain walls in magnetic nanowires has focused on flat, planar domain wall guides that have potential spintronic applications including racetrack memory, shift registers and domain wall logic devices. Both the domain wall structure and its chirality are important for applications since they have been shown to influence the domain wall pinning potential. In addition, a number of studies have shown the importance of metastable states, particularly in dynamic systems, where the domain wall is shifted using a spin-polarised current or applied magnetic field. Experiments have shown that domain walls can change type during propagation along the guide. Indeed, propagation of domain walls in planar nanowires is ultimately limited by Walker breakdown, which describes a process whereby an anti-vortex structure is periodically nucleated and annihilated at the wire edges, causing the motion of the domain wall to become non-uniform. The resulting technical problem is the instability and slow speed of magnetic domain walls.

The object of the invention is to provide a solution for the problem of instability of magnetic domain walls against magnetic stray fields.

According to the invention, this object is addressed by the subject matter of the independent claims. Preferred embodiments of the invention are described in the sub claims.

In one aspect of the present invention, the object is achieved by a tubular nanosized magnetic wire, wherein the nanosized magnetic wire comprises: a tubular magnetic shell surrounding a longitudinal axis of the wire, wherein at least one region of the tubular magnetic shell is capable of providing a 360° magnetic domain wall, wherein the 360° magnetic domain wall is self-stabilizing and has a magnetization going from a parallel alignment to a perpendicular alignment and to a parallel alignment with regards to the wire axis.

The tubular geometry of the nanosized magnetic wire allows for 360° domain walls (i.e. domainwalls in which the local magnetic polarization undergoes a 360° rotation when traversing from one domain to another) to be self stabilizing (i.e. topologically stabilized) as the domain walls loop around the tube and in on themselves.

Another advantage of the proposed tubular nanosized magnetic wire comprising a self-stabilizing, 360° magnetic domain wall is that due to its chirality a 360° domain wall can be moved through the system using field and current pulses. The proposed tubular nanosized magnetic wires are superior to current cutting edge technology in that, compared to conventional 180° domain walls, the 360° domain walls are self stabilizing, do not annihilate, and compared to other self stabilizing spin textures like skyrmions are not subject to drift, since any force acting perpendicular to the direction of motion performs an isomorphism on the texture. The magnetic wire is a magnetically hollow tube wherein magnetically hollow refers to the case that the inner core of the tubular core-shell wire device can be either empty or filled with a non-ferromagnetic, that is dia-, para-, or anti-ferromagnetic material.

In another preferred embodiment the tubular nanosized magnetic wire is a coaxial wire wherein a solid non-magnetic center core is surrounded by the tubular magnetic shell. This is advantageous because the 360° domain walls can be nucleated through vortex formation on the tips of the inner solid core.

In a preferred embodiment the tubular nano-sized magnetic wire according to one of the previous claims wherein the shape of the cross section of the tubular nanosized magnetic wire is circular or elliptical.

In another preferred embodiment the self-stabilizing, 360° magnetic domain wall is a Nèel-type magnetic domain wall.

In another preferred embodiment the self-stabilizing, 360° magnetic domain wall is a Bloch-type magnetic domain wall.

In another aspect of the invention, the object is achieved by a method of making a tubular nanosized magnetic wire with a self-stabilizing, 360° magnetic domain wall comprising the following steps: producing the nanowire, nucleating the 360° magnetic domain wall through vortex formation or magnetic fields.

In a preferred embodiment the tubular nanosized magnetic wire is made by inorganic chemical synthesis or colloidal synthesis comprising the steps of: synthesis of a ferromagnetic tubular nanosized wire, coating the tubular nanosized magnetic wire with a dia- or paramagnetic layer, coating the outside of the tubular nanosized magnetic wire with a ferromagnetic or ferrimagnetic layer by inorganic colloidal synthesis or atomic layer deposition. There are more thin film deposition techniques for making tubular nanosized magnetic wires, for example sputtering and molecular beam epitaxy.

In another preferred embodiment the step of producing the tubular nanosized magnetic wire comprises the step of: producing the tubular nanosized magnetic wire by template-assisted electrochemical synthesis. A first template-assisted electrochemical synthesis method is the electrodeposition of a non-magnetic nanosized wire inside a porous membrane template (e.g. anodized alumina, polycarbonate, silica) and partial removal of the membrane by plasma or chemical etching leaving the wires standing with a controlled length and coating the magnetic wire with a ferromagnetic or ferrimagnetic layer (by electrochemistry or sputtering). A second method is the electrodeposition of a ferro- or ferrimagnetic nanosized tube inside the pores of the template followed by electrodeposition of a concentric inner dia- or paramagnetic layer and followed by electrodeposition of a ferromagnetic nanosized core magnetic filament inside the concentric tubes.

In a preferred embodiment the step of producing the tubular nanosized magnetic wire comprises the step of: producing the tubular nanosized magnetic wire by in situ single-wire electrochemical synthesis. Wherein, the in situ single-wire electrochemical synthesis consists of the following steps: electrodeposition of the tubular nanosized wire inside the template in situ, single-wire electrochemical coating of the tubular nanosized magnetic wire with a dia- or paramagnetic layer, in situ single-wire electrochemical coating of the tubular nanosized magnetic wire with a ferromagnetic or ferrimagnetic layer.

In a preferred embodiment the step of producing the tubular nanosized magnetic wire comprises the step of: producing the tubular nanosized magnetic wire by additive manufacturing with nanoparticles. Additive Manufacturing techniques using nanoscale heating via electron beam, near-field lasing and/or two photon polymerization will be employed. Nanomagnetic core and magnetic shell will be built by melting size-selected nanoparticles that have the desired magnetic and non-magnetic properties either in the form of metallic, insulating or polycarbonate form. Particles can also be positioned by an ink-jet-like printing technology.

In another preferred embodiment the step of producing the tubular nanosized magnetic wire comprises the step of: producing the tubular nanosized magnetic wire by use of biological templates. Biological structures (e.g. tobacco virus) form regular nanotubes with nanoscale diameter and length and consist of non-ferromagnetic material. The tubes can be filled and coated by magnetic materials using deposition techniques described above, i.e. colloidal chemistry, electro deposition and thin film coating techniques.

In a preferred embodiment the step of producing the tubular nanosized magnetic wire comprises the step of: producing the tubular nanosized magnetic wire by standard electron beam lithography and mask techniques with successive sputtering steps. In another aspect of the invention the tubular nanosized magnetic wire is used in a racetrack memory device. Racetrack memory devices are gaining interest as high-density storage devices. The use of tubular nanosized magnetic wires according to the invention is advantageously due to their stability.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
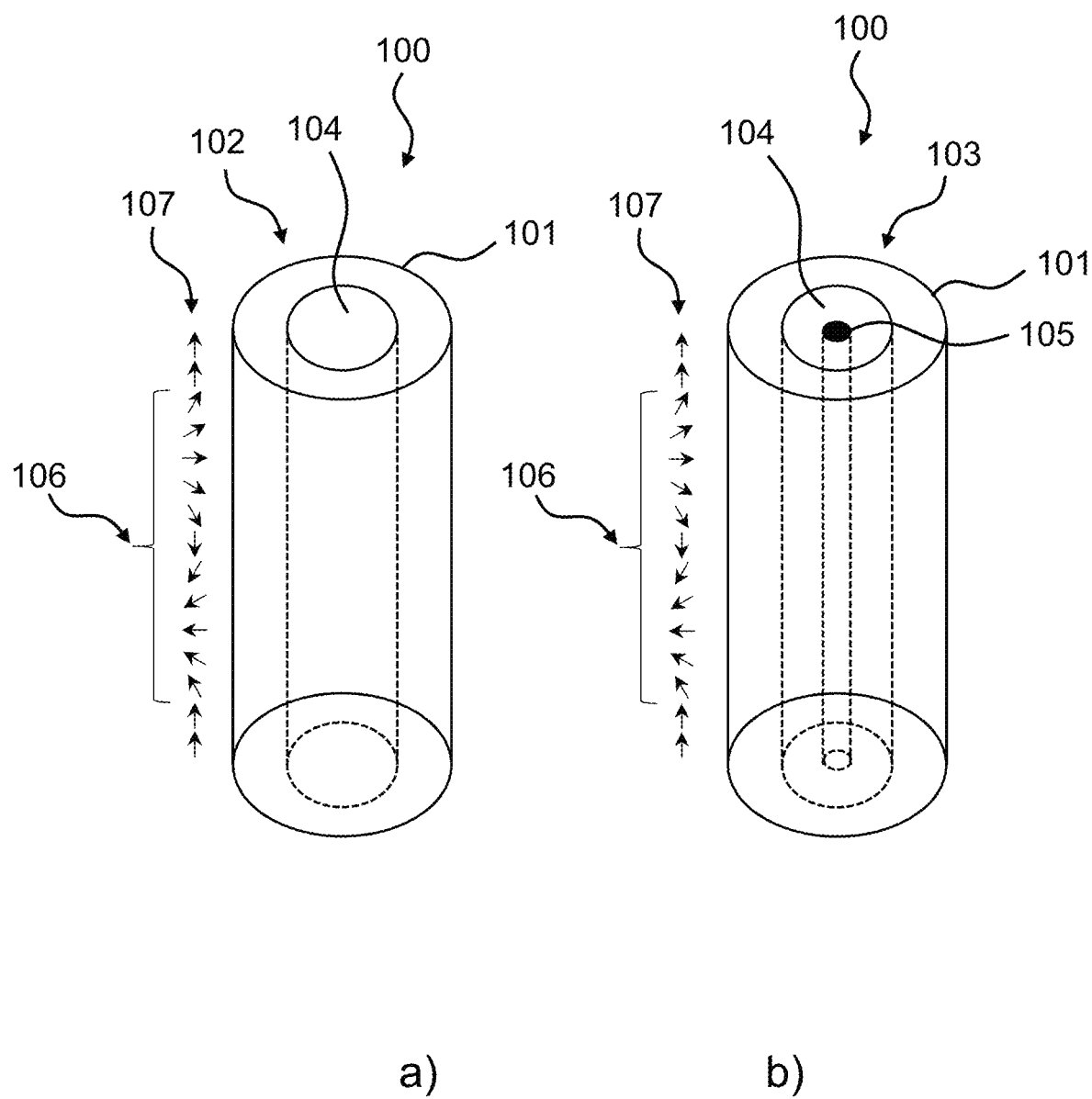
FIG. 1a) is a perspective view of one embodiment of the present invention showing a magnetic wire with a tubular shell, FIG. 1b) is a perspective view of another embodiment of the present invention wherein the magnetic wire is a coaxial wire with a tubular shell and a solid core, FIG. 2 schematically depicts a racetrack memory device making use of a tubular nanosized magnetic wire according to the present invention.

FIG. 1a) is a perspective view of one embodiment of the present invention showing a magnetic wire 100 with a tubular shell 101. According to FIG. 1a) the magnetic wire 100 is a magnetically hollow tube 102. The wording "magnetically hollow" refers to the case that the inner core 104 of the tubular magnetic wire 100 can be either empty or filled with a non-ferromagnetic, that is dia-, para-, or antiferromagnetic material.

The 360° domain walls 10 are perpendicular to the axis of the wire 100 with magnetization 107 going from parallel to perpendicular, to parallel alignment with regard to the wire 100 axis. The 360° domain walls 106 are stabilized by the morphology of the tubular hollow shell 101. Therefore one advantage of the proposed tubular nanosized magnetic wire 100 comprising a self-stabilizing, 360° magnetic domain wall 106 is that due to its chirality a 360° domain wall 106 can be moved through the system using field and current pulses. The proposed tubular nanosized magnetic wires 100 are superior to current cutting edge technology in that, compared to conventional 180° domain walls, the 360° domain walls 106 are self stabilizing, do not annihilate, and compared to other self stabilizing spin textures like skyrmions are not subject to drift, since any force acting perpendicular to the direction of motion performs an isomorphism on the texture.

The magnetic wire 100 can be designed with a length in the order of 100 to 1000 nm and da diameter of the order of 10 to 100 nm, the underlying physical principle makes it scalable up to the micrometer regime.

Figure 2:
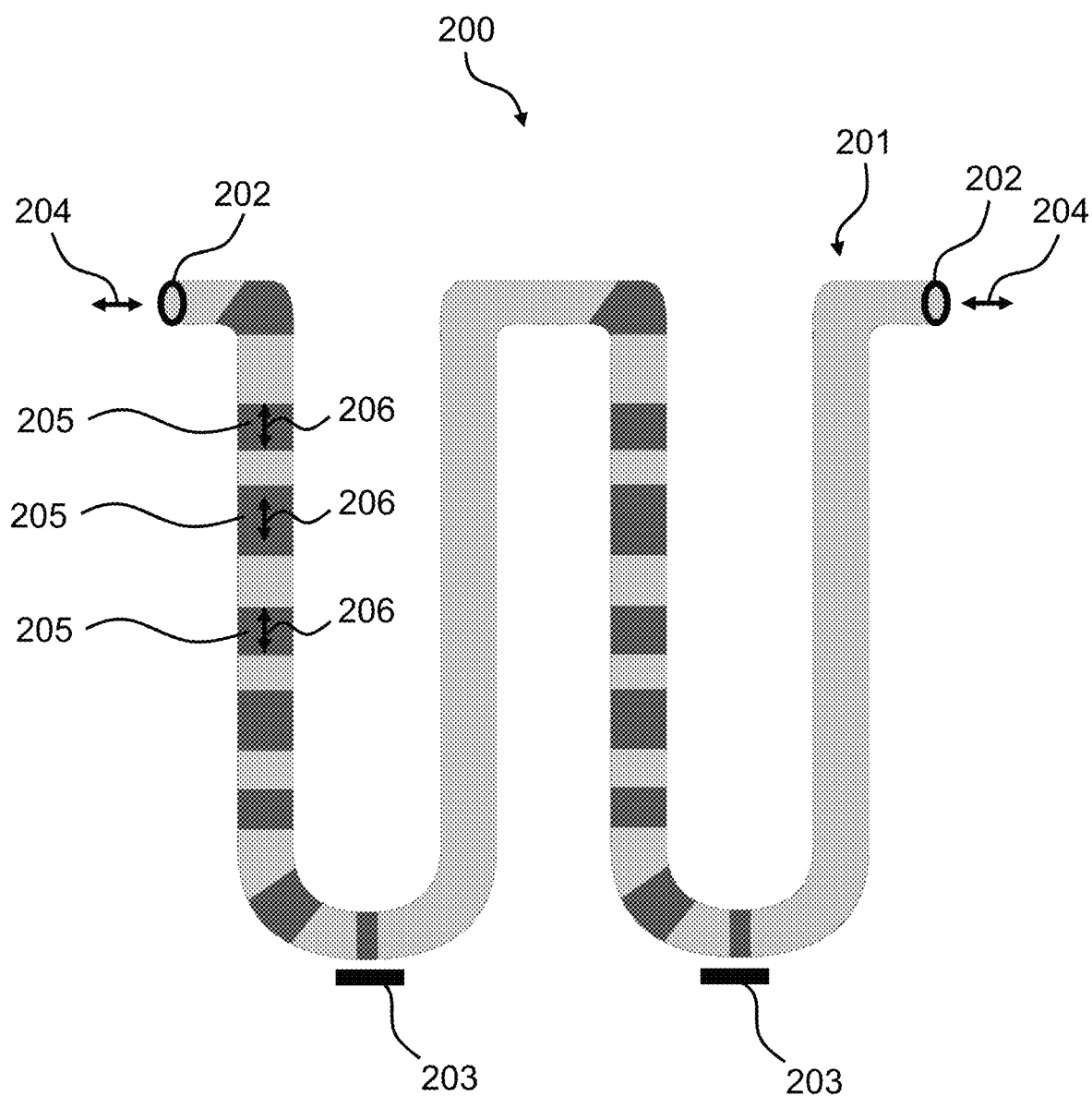

FIG. 1b) is a perspective view of another embodiment of the present invention. The magnetic wire 100 as shown in FIG. 1b) has a coaxial structure 103 with a tubular shell 101 and a solid core 105. According to FIG. 1b) the magnetic wire has a solid non-magnetic core 105. This is advantageous because the 360° domain walls 106 can be nucleated through vortex formation on the tips of the inner solid wire 105. The stray field of the inner wire 105 affects the outer tubular shell 101 in a way, that a 360° domain wall 106 is nucleated. Once the domain wall 106 is created, it remains stable until the field becomes large enough to break the stability and orient the magnetic moments along the field FIG. 2 schematically depicts a racetrack memory device 200 making use of a tubular nanosized magnetic wire 202 according to the present invention. A racetrack memory device 200 is a magnetic shift register that uses the inherent, natural properties of domain walls 205 in magnetic materials to store data. The shift register uses spin electronics without changing the physical nature of its constituent materials. The shift register comprises a fine track or strip of magnetic materials 201. Information is stored as domain walls 205 in the track 201. An electric current 204 is applied to the track 201 to move the magnetic moments along the track 201 past a reading or writing device 203. In a magnetic material 201 with domain walls 205, a current 204 passed across the domain wall 205 moves the domain wall 205 in the direction of the current flow 206. As the current 204 passes through a domain, it becomes "spin polarized". When this spin polarized current passes through the next domain and across a domain wall, it develops a circle of spin torque. This spin torque moves the domain wall 205.

Figure 3:
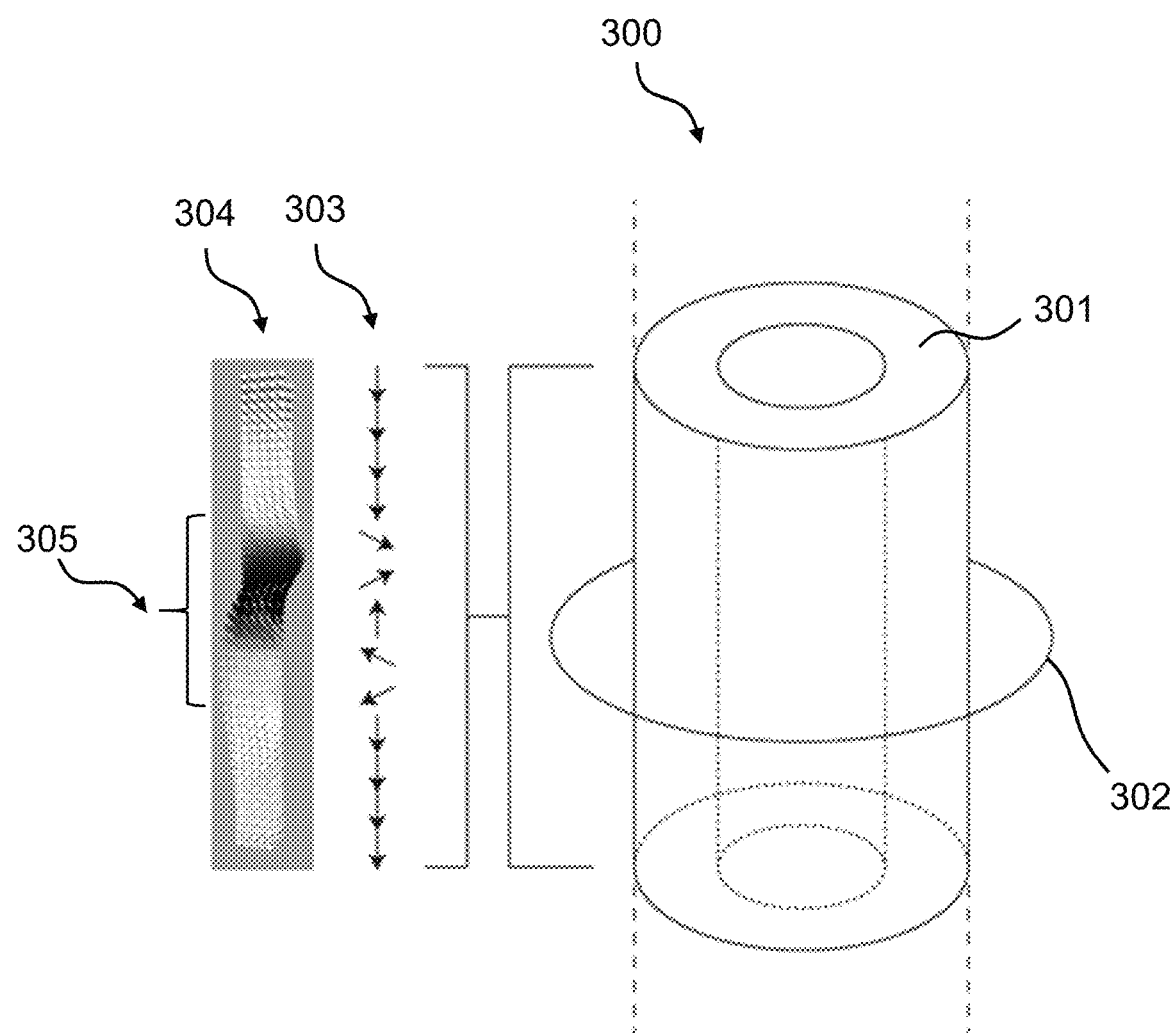
FIG. 3 is a perspective view of still another embodiment of the present invention showing a hollow tube with a tubular shell and a read/write element that is part of a racetrack memory device.

FIG. 3 is a perspective view of still another embodiment of the present invention showing a tubular magnetic 300 wire with a tubular shell 301 and a read/write element 302 that is part of a racetrack memory device 200. The tubular magnetic wire 300 forms the racetrack 201 as shown in FIG. 2. According to FIG. 3 the magnetic wire 300 has a tubular shell 301. A read/write element 302 from a racetrack memory device 200 is positioned around the shell 301. Writing domain walls 305 can be carried out with a variety of schemes, including using the self-field of currents passed along neighboring metallic nanowires; using the spin-momentum transfer torque effect derived from current injected into the racetrack from magnetic nanoelements; or using the fringing fields from the controlled motion of a magnetic domain wall in a proximal nanowire writing element. FIG. 3 also shows the axial magnetization distribution 303 inside the shell 301 of the magnetic wire 300. FIG. 3 further shows the magnetic texture of the 360° magnetic domain wall 304 inside the shell 301 of the magnetic wire 300.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST tubular nanosized magnetic wire 100
tubular shell 101
hollow tube 102
coaxial wire 103
inner core 104
solid center core 105
360° magnetic domain wall 106
axial magnetization distribution inside tubular shell 107
racetrack memory device 200
racetrack 201
tubular magnetic wire 202
read/write element of racetrack memory device 203
current 204
360° magnetic domain wall 205
moving direction of the domain walls 206
tubular nanosized magnetic wire 300
shell 301
read/write element of racetrack memory device 302
axial magnetization distribution inside tubular shell 303
magnetic texture of 360° magnetic domain wall 304
360° magnetic domain wall 305

The invention claimed is:

1. A tubular nanosized magnetic wire, wherein the nanosized magnetic wire comprises:
   a tubular magnetic shell surrounding a longitudinal axis of the wire, wherein
   at least one region of the tubular magnetic shell is capable of providing a 360° magnetic domain wall, wherein the 360° magnetic domain wall is self-stabilizing and has a magnetization going from a parallel alignment to a perpendicular alignment and to a parallel alignment with regards to the wire axis.

2. The tubular nanosized magnetic wire according to claim 1, wherein
   the tubular nanosized magnetic wire is a coaxial wire wherein a solid non-magnetic center core is surrounded by the tubular magnetic shell.

3. The tubular nanosized magnetic wire according to claim 1, wherein
   the shape of the cross section of the tubular nanosized magnetic wire is circular or elliptical.

4. The tubular nanosized magnetic wire according to claim 1, wherein
   the self-stabilizing, 360° magnetic domain wall is a Nèel-type magnetic domain wall.

5. The tubular nanosized magnetic wire according to claim 1, wherein
   the self-stabilizing, 360° magnetic domain wall is a Bloch-type magnetic domain wall.

6. The use of the tubular nanosized magnetic wire according to claim 1 in a racetrack memory device.

* * * * *